(12) United States Patent
Sorgeloos

(10) Patent No.: US 7,986,502 B2
(45) Date of Patent: Jul. 26, 2011

(54) HIGH TRIGGER CURRENT SILICON CONTROLLED RECTIFIER

(75) Inventor: Bart Sorgeloos, Pittem (BE)

(73) Assignee: Sofics BVBA, Gistel (BE)

( * ) Notice: Subject to any disclaimer, the term of this patent is extended or adjusted under 35 U.S.C. 154(b) by 74 days.

(21) Appl. No.: 12/500,185

(22) Filed: Jul. 9, 2009

(65) Prior Publication Data
US 2010/0008002 A1    Jan. 14, 2010

Related U.S. Application Data

(60) Provisional application No. 61/079,221, filed on Jul. 9, 2008.

(51) Int. Cl.
*H02H 9/00* (2006.01)
*H01C 7/12* (2006.01)
*H02H 1/00* (2006.01)

(52) U.S. Cl. .......................................... 361/56; 361/118
(58) Field of Classification Search ...................... 361/56
See application file for complete search history.

(56) References Cited

U.S. PATENT DOCUMENTS
6,803,633 B2 * 10/2004 Mergens et al. .............. 257/358
* cited by examiner

*Primary Examiner* — Dharti H Patel
(74) *Attorney, Agent, or Firm* — Volpe and Koenig, P.C.

(57) ABSTRACT

An ESD protection circuit including an SCR having at least a PNP transistor and at least a NPN transistor such that said PNP transistor is coupled to an anode and the NPN transistor is coupled to a cathode. The circuit also includes a first resistor coupled between the anode and the base of the pnp transistor and a second resistor coupled between the cathode and the base of the npn transistor. A parasitic distributed bipolar transistor is formed between said first and second transistor to control triggering of the SCR.

20 Claims, 5 Drawing Sheets

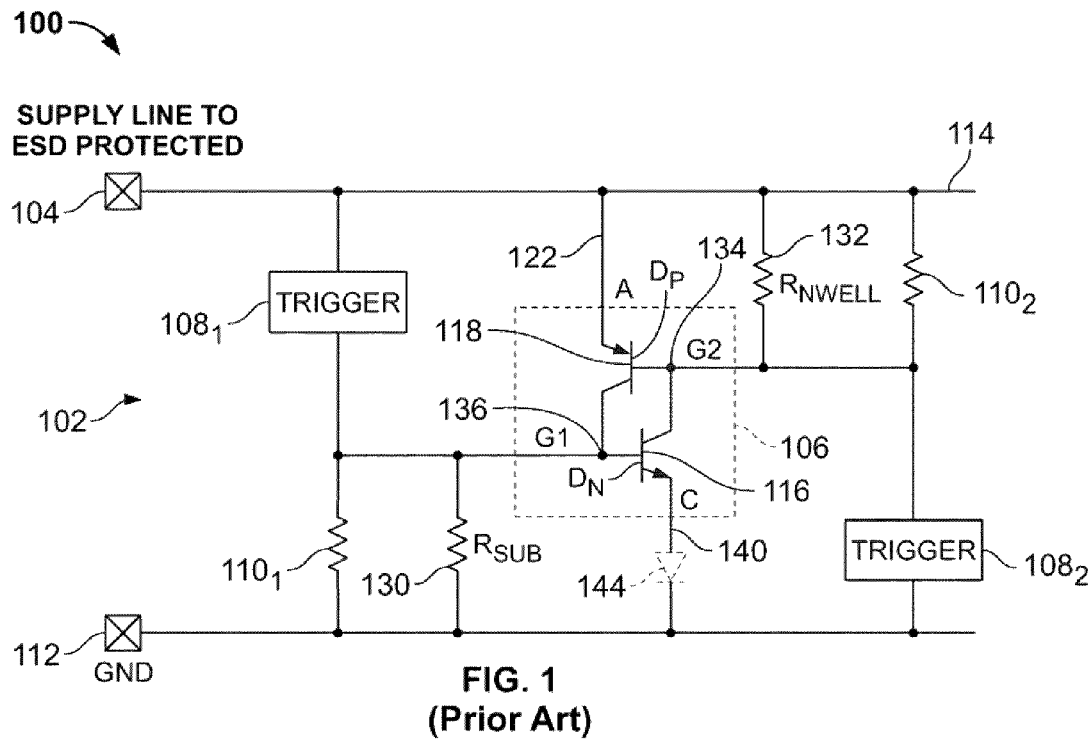
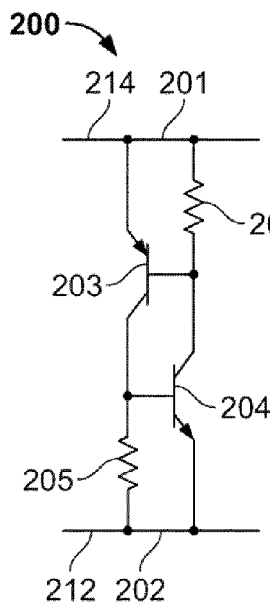 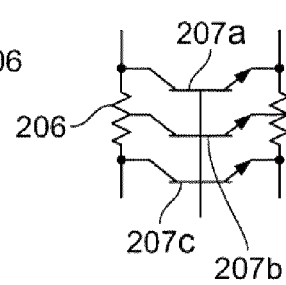 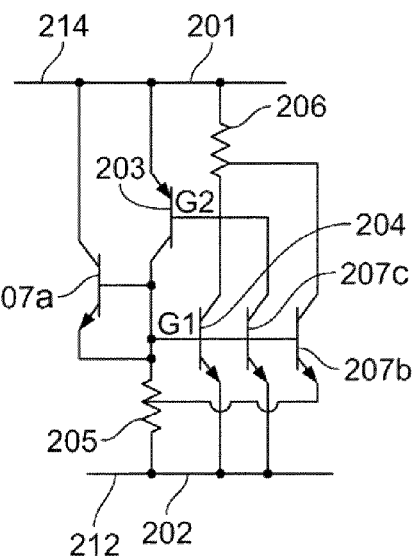
FIG. 2A    FIG. 2B    FIG. 2C

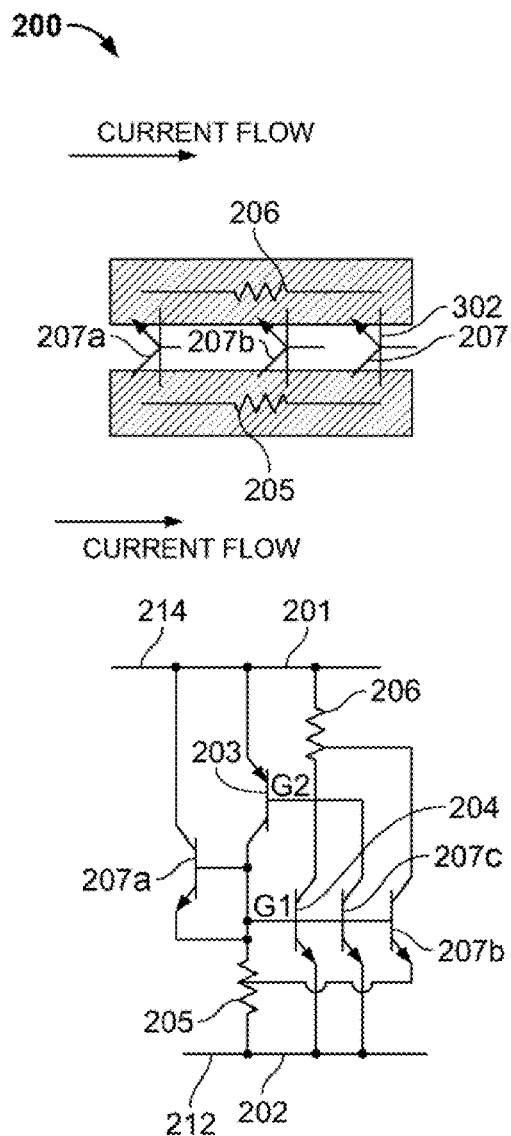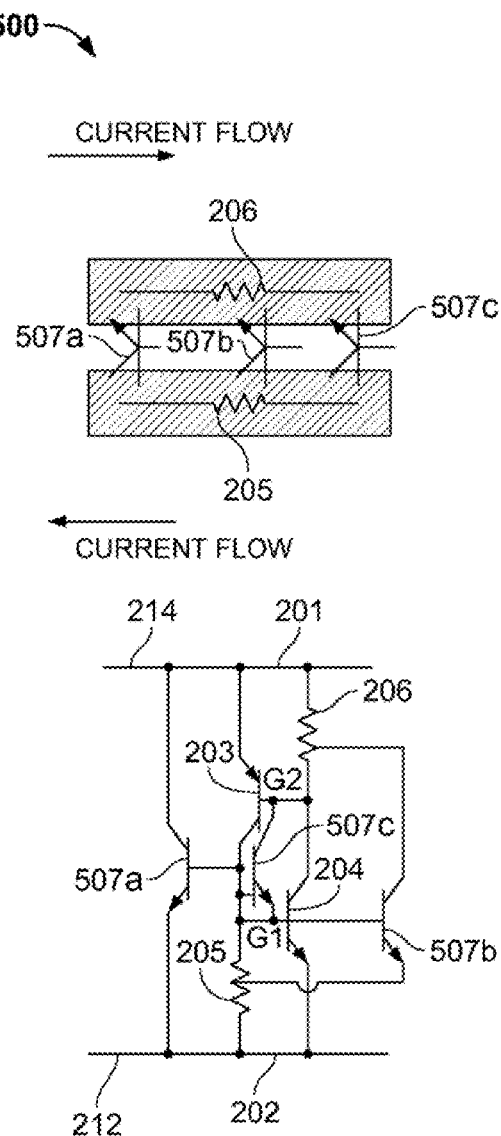

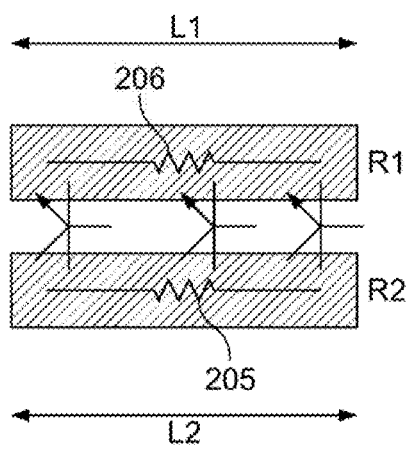
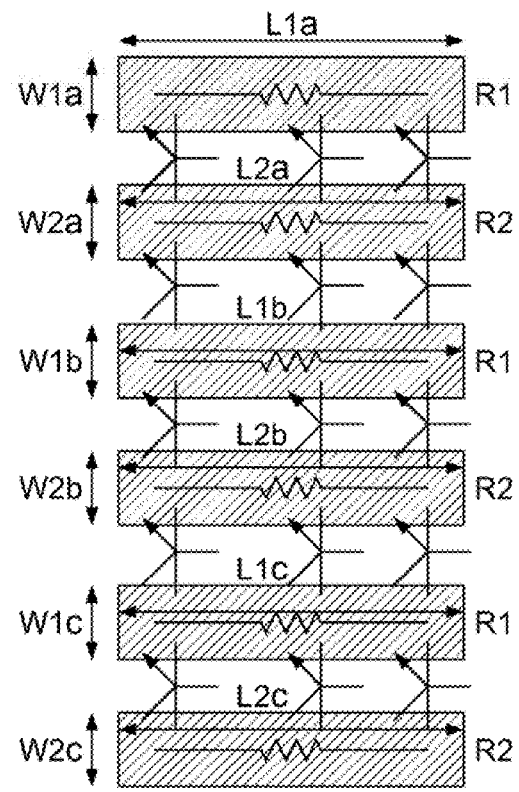
W1 = W1a + W1b + ...
W2 = W2a + W2b + ...
L1 = L1a + L1b + ..
L2 = L2a + L2b +..
FIG. 6

HIGH TRIGGER CURRENT SILICON CONTROLLED RECTIFIER

CROSS REFERENCES

This patent application claims the benefit of U.S. Provisional Application Ser. No. 61/079,221 filed Jul. 9, 2008, the contents of which are incorporated by reference herein.

FIELD OF THE INVENTION

The present invention generally relates to circuits that provide improved electrostatic discharge (ESD) protection, and more particularly to method and apparatus for providing a high trigger current silicon controlled rectifier.

BACKGROUND OF THE INVENTION

Silicon controlled rectifiers (SCRs) have long been used over a broad range of technologies because of their superior performance. During an ESD event, the SCR is considered a superior device because the SCR acts as an almost ideal shunt element.

One concern in the industry about using SCRs as ESD protection devices is unintentional latch-up during normal operating conditions. Latch-up is an uncontrolled triggering of an (parasitic) SCR structure on the IC during normal operation, such that the supply voltage is shorted to ground. The holding currents of such (parasitic) SCR structures are specified in the industry as the minimum latch-up current. Typical values are a minimum of 100 milliamps, or up to 300-500 milliamps under severe operating conditions. A latch-up condition could lead to very high currents from the power supply that may permanently damage the IC.

One method to avoid latch-up in the SCR ESD protection devices is to provide serial coupled diodes between, for example, a pad and the anode of the SCR, such that the holding voltage is kept above the supply voltage. In other words, when the holding voltage is above the supply voltage (including some safety margin), the risk of a latch-up condition is avoided. Generally, there is a tendency in the industry to use lower voltages to power the IC's, yet there are circuit applications where even much higher voltages are required (e.g., automotive applications or IC's for certain functions in cellular phones). Accordingly, the higher the supply voltage, the more series diodes are required.

The use of the series diodes with the SCR has several disadvantages. A first disadvantage for such a high holding voltage is that a considerable number of serial coupled diodes would be a needed, which requires additional area on the IC. A second disadvantage is that the serial diodes add extra resistance during ESD stress, except for increasing the holding voltage. A third disadvantage is that a large number of series diodes may result in high leakage currents, due to a parasitic Darlington transistor to the substrate that amplifies an initial leakage current and becomes more problematic at higher operating temperatures.

In particular, each serial diode forms a stage of the Darlington transistor, and the stages are connected such that the leakage current of one stage is being amplified by the next stage, and so forth. This is called the Darlington amplifier in standard circuit theory, and the more of these Darlington stages are coupled, the more leakage current is generated. Moreover, during high ambient or operating temperatures of the chip, the leakage current increases, because there is more thermal carrier generation. As such, the series diodes pose a strong limit to the application of the SCR devices for also satisfying the above-mentioned latch-up concern.

Another solution is to increase the trigger current above the maximum current injected during the latch up test. This is known as high holding current silicon controlled rectifier (HHISCR) ESD protection device which is disclosed in prior art U.S. Pat. No. 6,803,633. FIG. 1 of the present invention illustrates the HHISCR ESD protection device 100 of the prior art U.S. Pat. No. 6,803,633 in which the device is utilized as a shunt between at least one voltage supply (Vdd) 104 and ground 112. As shown in FIG. 1, larger area is needed to create resistors 110 and the trigger 108 to turn on the SCR 106.

Therefore, there is a need in the art for an improved HHISCR ESD protection device having a structure occupying less area with increase in its triggering speed while providing for a high immunity to latch-up condition during normal operation.

SUMMARY OF THE INVENTION

The present invention provides an electrostatic discharge (ESD) protection circuit having an SCR including at least a PNP transistor and at least a NPN transistor such that the PNP transistor is coupled to an anode and the NPN transistor is coupled to a cathode. A first resistor coupled between the anode and the base of the pnp transistor, a second resistor coupled between the cathode and the base of the npn transistor. A parasitic bipolar transistor is formed between the first and second resistor which functions to control triggering of the SCR during ESD.

BRIEF DESCRIPTION OF THE DRAWINGS

The present invention will be more readily understood from the detailed description of exemplary embodiments presented below considered in conjunction with the attached drawings, of which:

FIG. 1 illustrates HTIRSCR of an ESD protection device in accordance with a prior art.

FIG. 2 illustrates HTIRSCR of the ESD protection device in accordance with the present invention.

FIG. 3 illustrate a cross section layout of the resistors of the HTIRSCR in accordance with one embodiment of the present invention.

FIG. 5 illustrates a cross section and circuit layout of the HTIRSCR in accordance with an alternate embodiment of the present invention.

FIG. 6 illustrates a cross section layout of the resistors of the HTIRSCR in accordance with an alternate embodiment of the present invention.

Figure 4:
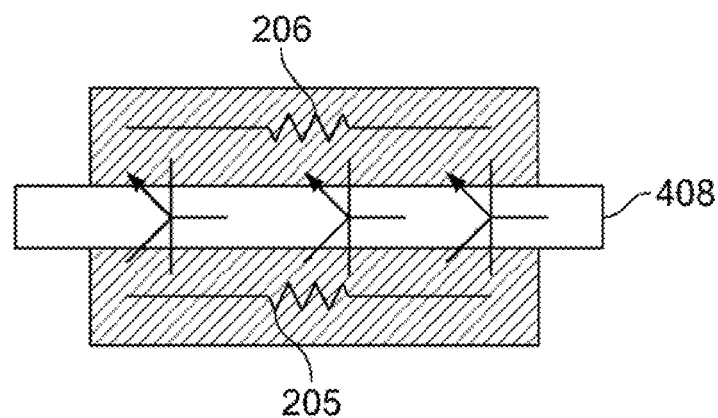
FIGS. 4, 4A and 4B illustrate a cross section layout of the resistors of the HTIRSCR in accordance with another embodiment of the present invention.

It is to be understood that the attached drawings are for purposes of illustrating the concepts of the invention.

DETAILED DESCRIPTION OF THE INVENTION

Referring to FIG. 2A there is shown a schematic circuit diagram of a high holding current silicon controlled rectifier (HHISCR) ESD protection device 200 in accordance with an embodiment of the present invention. The HHISCR ESD protection device 200 of FIG. 2 is a general, non-actively controlled protection device that serves as a current shunt between a voltage supply line 214 and ground 212. The HHISCR protection device 200 comprises an SCR including a pnp transistor 203, an npn transistor 204, at least two resistors 205 and 206 between a first voltage potential at node 201, ex: voltage supply line 214 ex. Vdd and the second voltage potential at node 202, ex: ground 212, which together serve as a protection device 200 for the circuitry on an integrated circuit (IC). The HHISCR protection device 200 protects the IC circuitry from electrostatic discharges (ESD) that may occur at a voltage supply line 201 to be protected of the IC circuitry. When turned on, the SCR 202 functions as a shunt to redirect any ESD currents from the voltage supply line 202 to ground 201.

The resistors 205 and 206 have low resistance values preferably in the range of 2 and 100 Ohms to ensure the high trigger current. Additionally, the resistors 205 and 206 in this embodiment are active resistors. In other words, the resistors 205 and 206 are formed by doped regions in a well. Typical implementations of the resistors 205 and 206 are highly or lowly N or P doped regions in an Nwell or PWell substrates respectively. Also salicide/silicide block layers, special implant layers and like may preferably be used to adapt the resistance value. The resistors 205 and 206 shown here each have a first terminal and a second terminal such that the first terminal of resistor 205 is adjacent to the first terminal of the resistor 206 and the second terminal of the resistor 205 is adjacent to the second terminal of the resistor 206.

Referring to FIG. 2B there is shown a circuit diagram lay out of the resistors 205 and 206 of the device 200 in FIG. 2A. The resistors 205 and 206 in this example are formed by N doped regions in the P-substrate. As illustrated, a parasitic bipolar transistor, in this example, an NPN transistor 207 is formed between the two resistors 205 and 206. As shown in FIG. 2C, a parasitic npn 207a is formed at the top, a parasitic npn 207b is formed in the middle and a parasitic npn 207c is formed in the bottom of the two resistors 205 and 206. This serves as a distributed resistance trigger between the two resistors 205 and 206 as will be described in greater detail with respect to FIG. 2C below. It is noted that the number of bipolar transistors does not have to three as illustrated in FIG. 2. The number of bipolar transistors may be less than three or more than three. In fact, the three bipolar transistors 207a, 207b and 207c shown in FIG. 2 represent a simplified circuit representation of a distributed bipolar transistor. The bipolar 207a represent the top part of the distributed bipolar, 207b the middle part and 207c the bottom part.

Referring to FIG. 2C, there is shown the circuit diagram of the HHISCR ESD protection device 200 with respect to the distributed triggering. As shown, the three parasitic bipolar transistors 207a, 207b and 207c are formed between the two resistors 205 and 206. Bipolar transistor 207a, for example, is coupled directly between the anode 201 and the G1 trigger tap as shown. Bipolar transistor 207b is coupled directly in the middle of the resistors 205 and 206 and the bipolar transistor 207c is coupled directly between the G2 trigger tap and ground 202. Current will flow through a part of resistor 205, resistor 206 and the bipolar 207. For the first represented bipolar 207a, the current will flow through the bipolar 207a and flow completely through the resistor 205. The current through the second represented bipolar 207b will flow only through half of the resistor 205, but also through half of die resistor 206. The current through the third represented bipolar 207c will flow through the bipolar 207c and flow completely through the total resistor 206. So all current during triggering will flow through a part of bipolar 207 and a part of resistor 205 and 206 in a distributed way. Through this distributed approach the trigger current will flow partly in trigger tap G1 of the npn 204 of the SCR (especially through bipolar transistor 207a) but also a part of the current will flow in trigger tap G2 of the pnp 203 of the SCR (especially through bipolar transistor 207c). Thus, current in bipolar transistor 207b will flow partly in G1 of the npn 204 of the SCR and partly in G2 of the pnp 203 of the SCR. So in a distributed way the SCR is triggered both in G1 and G2. This "dual" triggering will make the SCR faster.

In the prior art, there is only current flowing either into G1 or G2. So, for example if the current flows only into G2, it will only turn on the pnp 203 first, then current of the pnp 203 will turn on the npn 204. In the distributed approach of the embodiment illustrated in FIG. 2, the current is being injected not only into the pnp 203 via G2 to turn on the npn 204 but also being injected directly into the npn 204 via G1 to turn on the npn 204. So, not only is the current flowing to the npn 204 through the pnp 203 but also directly flowing into the npn 204 to help the npn 204 to turn on. So, in this distributed way, the SCR is triggered both in G1 and G2 taps (i.e. dual triggering), making the SCR trigger faster than the prior art. Clearly as described above and illustrated in FIG. 2C, the current flow between the two resistors 205 and 206 is in same direction from the anode 201 to the cathode/ground 202.

Thus, by combining the two resistors 205 and 206 as discussed above, the bipolar transistor 207 is formed which is used to improve the trigger of the SCR. One of the advantages of the present invention is that these resistors are used as a triggering element eliminating the need of an additional trigger element required in the prior art. Also, in the prior art, only one of the trigger taps, G1 or G2 of the SCR trigger during normal operation. Whereas, in the present invention with the distributed triggering as described above, both the G1 and G2 trigger taps trigger during normal operation, thus increasing the triggering speed of the SCR.

Referring to FIG. 3, there is shown a top view lay out of the resistors 205 and 206 of FIG. 2 and the HHISCR circuit device 200 in accordance with the embodiment of the present invention. Note that this HHISCR circuit device 200 is same as the HHISCR device 200 shown in FIG. 2C. The resistors 205 and 206 in this example are formed by N doped regions in the P-substrate. In this embodiment, similar to FIG. 2C, the first terminal of the resistor 206 is coupled to the anode 201 and the second terminal of the resistor 206 is coupled to the base of the pnp 203. Also, the first terminal of the resistor 205 is coupled to the base of the npn 204 and the second terminal of the resistor 205 is coupled to the cathode 202. As illustrated, the parasitic bipolar transistor, the NPN transistor 207 is formed between the two resistors 205 and 206. The isolation 302 may preferably be formed between the resistors 205 and 206 by allowing formation of shallow trench isolations (STI), or deep trench isolations (DTI) or even partial trench isolations (PTI). Alternatively, it may be formed by silicide block (SB), in case of silicided processes, or placing a Poly gate in between. Although, not shown the base (P substrate or Pwell surrounding the N doped regions) of each of the npn transistors 207a, 207b and 207c can be controlled by either being ground or connected to a control circuit such as resistors, capacitors, diodes, MOS, SCR, inductors, and like or combination of these elements.

Figure 4A:
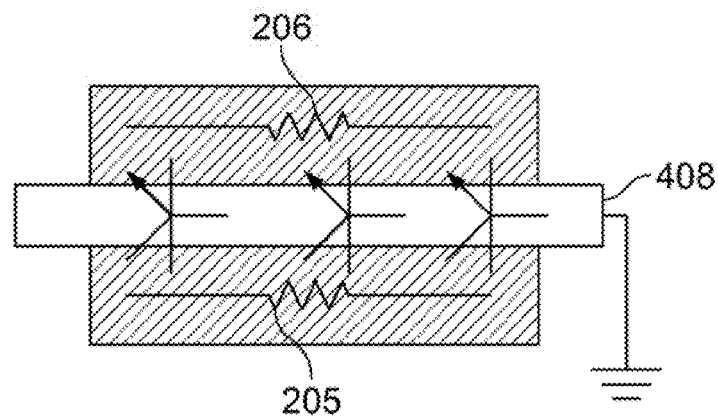
Figure 4B:
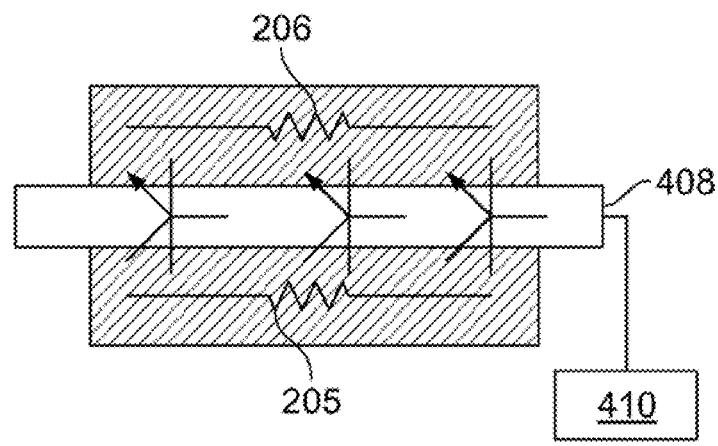

Referring to FIG. 4, there is shown a cross section lay out of the two resistors 205 and 206 of the device 200 with respect to another embodiment of the present invention. In this embodiment, a gate 408 is preferably placed between the two resistors 205 and 206. This will induce a smaller space between the two resistors 205 and 206 and also isolation between the junctions is removed, resulting in increasing the beta and efficiency of the bipolar transistor 207 This will provide a smaller base length between the two resistors 205 and 206 will increase the beta and speed of the bipolar transistor 207. This gate 408 can be grounded as shown in FIG. 4A or connected to a control circuit as shown in FIG. 4B. Such control circuit may include resistors, capacitors, diodes, MOS, SCR, inductors, and like or combination of these elements.

As described above with respect to FIG. 3, the orientation of the current flow in the two resistors 205 and 206 were in the same direction (to parallel), i.e. from the anode 201 to the cathode 202. This orientation can be changed to anti-parallel by altering the connection between the two resistors 205 and 206. Referring to FIG. 5, there is shown a circuit diagram of the HHISCR ESD protection device 500 in accordance with another embodiment of the present invention. In this embodiment, the first terminal of the resistor 205 is placed adjacent to the second terminal of the resistor 206 and the second terminal of the resistor 205 is placed adjacent to the first terminal of the resistor 206.

Further in the embodiment of FIG. 5, the bipolar transistor (NPN) 507a is now formed directly between the anode nodes 201 and cathode/ground 202 and bipolar transistor (NPN) 507c s formed directly between the G1 and G2. So, in this embodiment, the current will flow directly from the anode 201 to the cathode 202 via the bipolar transistor 507a. So, there is no current flowing through the resistors 205 and 206 (no voltage built up in the resistors) via the bipolar transistor 507a and thus will not help trigger the SCR. The current flowing through the bipolar transistor (NPN) 507b is similar to the bipolar transistor 207b such that it flows only through half of the resistor 205, but also through half of the resistor 206. So, in this embodiment, the only current that helps trigger the SCR is the current flowing through bipolar transistor 507c from the G2 trigger tap to G1 trigger tap and a small part of the current flowing through the bipolar transistor 507b. The SCR is still triggered by G1 tap and G2 tap. One of the advantages of this embodiment is that more current is required to trigger the SCR. The current through bipolar 507a will not help to have a voltage built-up in the resistors 206 and 205.

In order to trigger the SCR, there must be 0.7V over the resistors 206 and 205 to turn on the base emitter of the PNP 203 and NPN 205 of the SCR. So, as discussed above, in this embodiment, bipolar transistor 507a will not contribute any current to trigger the SCR, bipolar transistor 507b will only contribute half of the current flowing through the bipolar for turning on the SCR and the bipolar transistor 507c will contribute all the current flowing through the bipolar for turning on the SCR. In the previous embodiment as described in FIG. 2 and FIG. 3, all the three bipolars 207a, 207b and 207c contribute all the current flowing through it for turning on the SCR (flows through the resistor 205 or the resistor 206). The advantage of this embodiment is that the total trigger current will increase. Even though, the same amount of current through the resistors 205 and 206 is still needed, the bipolars 507 will contribute only a part of their current to help the SCR to trigger, so more current is needed to trigger the SCR, thus, it will be more latch up safe.

Even though the above embodiments are illustrated and described with respect to an NPN bipolar transistor, one in the ordinary skill in the art would appreciate that the bipolar transistor can also be a PNP transistor and function similarly as discussed above with respect to the NPN bipolar transistor.

Referring to FIG. 6, there is shown that width, W1 of the resistor R1 206 is divided into smaller segments, for example, W1a, W1b and W1c; and length L1 of the resistor R1 206 is divided into smaller segments, for example, L1a, L1b, and L1c. Similarly the width W2 of the resistor R2 205 can be divided into smaller segments, for example, W2a, W2b and W2c; and length L2 of the resistor R2 205 is divided into smaller segments, for example, L2a, L2b and L2c. The total width W1 of R1 206 is combination of W1a, W1b and W1c and total length of R1 206 is combination of L1a, L1b and L1c. One of the advantages of dividing the resistors into smaller segments is that the total structure of the ESD device can be drawn even smaller. The values of the width and the length can preferably be optimized to define the resistor value to form the bipolar transistors. The ratio of the total width (W) and total length (L) is defined by the resistance value, i.e. R=Rs. L/W, with Rs the sheet resistance (fixed value dependent on the process/technology) of the resistor. The minimum width W is defined by the trigger current (Itl) as Wmin>Itl/Imax, with Imax the maximum current (mA/um) that the resistor can handle without failure of the resistor. The minimum length is defined by Lmin>Itl/Imax,bip, with Imax,bip the maximum current (mA/um) that the bipolar can handle without failure of the bipolar. The fourth parameter to optimize is the total area. This must be a minimum respecting the above formula. So, if there is current flowing in the bipolar transistor higher than the Imxa,bip, the resistors R1 and R2 are divided into segments of multiple lengths and widths so the ratio L/W can be maintained to keep the same resistance value, R. By splitting the resistors R1 and R2, the area of the resistors R1 and R2 still remains the same but the bipolar is much stronger since the multiples of R1 and R2 include the bipolar transistors on both sides as shown in FIG. 6.

Figure 7:
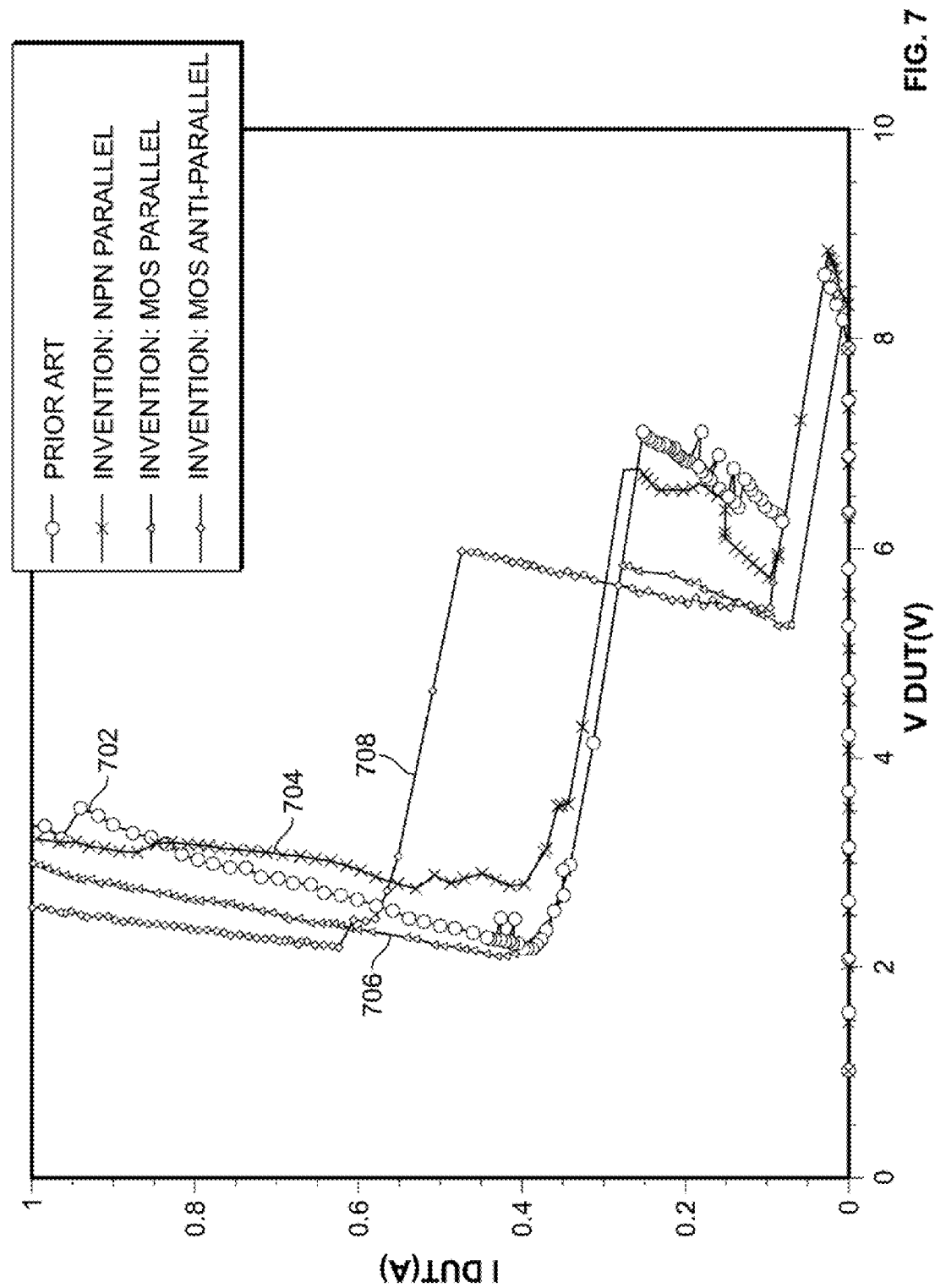
FIG. 7 illustrates a graphical representation of the comparison of the trigger voltage/current of the present invention with the prior art.

Referring to FIG. 7 there is illustrated a graphical representation of the measurements of the trigger voltage and the trigger of the present invention in comparison with the prior art. The measurement of line 704 is the HHISCR defined with respect to FIG. 3 above with isolation between the resistors 205 and 206. The measurement of line 706 is the HHISCR defined with respect to FIG. 4 above with a gate placed between the resistors 205 and 206. The measurement of line 708 is the HHISCR defined with respect to FIG. 5 above in which the resistor connections are made using less space compared to the connections in FIGS. 3 and 4. As shown, the trigger current is increased without increasing the value of the resistance and the area. Thus, this embodiment provides an even more secure latch-up environment. Whereas, as shown with the measurements in line 702 of the prior art, the triggering current does not increase as much as it does with the measurements of the present invention embodiments shown in measurements of lines 704, 706 and 708.

Although various embodiments that incorporate the teachings of the present invention have been shown and described in detail herein, those skilled in the art can readily devise many other varied embodiments that still incorporate these teachings without departing from the spirit and the scope of the invention.

The invention claimed is:

1. An electrostatic discharge (ESD) protection circuit comprising:
   a silicon controlled rectifier (SCR) comprising at least a PNP transistor and at least an NPN transistor such that the PNP transistor is coupled to an anode of the SCR and the NPN transistor is coupled to a cathode of the SCR;
   a first resistor coupled between the anode of the SCR and the base of the PNP transistor;
   a second resistor coupled between the cathode of the SCR and the base of the NPN transistor; and
   a parasitic bipolar transistor formed between the first resistor and the second resistor and comprising the first resistor and the second resistor, wherein the bipolar transistor functions to control triggering of the SCR during an ESD event.

2. The ESD protection circuit of claim 1 wherein the first resistor comprises a first highly doped region and the second resistor comprises a second highly doped region, and wherein the second highly doped region is adjacent to the first highly doped region.

3. The ESD protection circuit of claim 2 wherein the first highly doped region is an N-type region in a P-well substrate, the second highly doped region is an N-type region in the P-well substrate, and wherein an emitter of the parasitic bipolar transistor comprises the first highly doped region, a collector of the parasitic bipolar transistor comprises the second highly doped region, and a base of the parasitic bipolar transistor comprises the P-well substrate.

4. The ESD protection circuit of claim 2 wherein the first highly doped region is a P-type region in an N-well, the second highly doped region is a P-type region in the N-well, and wherein an emitter of the parasitic bipolar transistor comprises the first highly doped region, a collector of the parasitic bipolar transistor comprises the second highly doped region, and a base of the parasitic bipolar transistor comprises the N-well.

5. The ESD protection circuit of claim 2 wherein an isolation is formed between the first highly doped region and the second highly doped region, and wherein the isolation comprises at least one of: shallow trench isolation (STI), deep trench isolation (DTI), partial trench isolation (PTI), or silicide block (SB).

6. The ESD protection circuit of claim 2 wherein a gate is formed between the first highly doped region and the second highly doped region.

7. The ESD protection circuit of claim 6 wherein a control circuit is coupled to the gate.

8. The ESD protection circuit of claim 7 wherein the control circuit comprises at least one of a diode, MOS, resistor, capacitor, inverter, or SCR.

9. The ESD protection circuit of claim 2 wherein the first highly doped region includes a first terminal and a second terminal and the second highly doped region includes a first terminal and a second terminal.

10. The ESD protection circuit of claim 9 wherein the first terminal of the first highly doped region is placed adjacent to the first terminal of the second highly doped region and the second terminal of the first highly doped region is placed adjacent to the second terminal of the second highly doped region.

11. The ESD protection circuit of claim 10 wherein the first terminal of the first highly doped region is coupled to the anode of the SCR, the second terminal of the first highly doped region is coupled to a base of the PNP transistor, the first terminal of the second highly doped region is coupled to a base of the NPN transistor and the second terminal of the second highly doped region is coupled to the cathode of the SCR.

12. The ESD protection circuit of claim 9 wherein the first terminal of the first highly doped region is placed adjacent to the second terminal of the second highly doped region and the second terminal of the first highly doped region is placed adjacent to the first terminal of the second highly doped region.

13. The ESD protection circuit of claim 12 wherein the first terminal of the first highly doped region is coupled to the anode of the SCR, the second terminal of the first highly doped region is coupled to a base of the PNP transistor, the first terminal of the second highly doped region is coupled to a base of the NPN transistor and the second terminal of the second highly doped region is coupled to the cathode of the SCR.

14. The ESD protection circuit of claim 2 wherein the first highly doped region comprises at least one segment and the second highly doped region comprises at least one segment.

15. The ESD protection circuit of claim 14 wherein the segments of the first highly doped region are coupled in parallel and the segments of the second highly doped region are coupled in parallel.

16. The ESD protection circuit of claim 14 wherein the segments of the first highly doped region are interleaved with the segments of the second highly doped region.

17. The ESD protection circuit of claim 2 wherein the first highly doped region and the second highly doped region are placed such that a current flowing through the first highly doped region flows parallel to a current flowing through the second highly doped region.

18. The ESD protection circuit of claim 2 wherein the first highly doped region and the second highly doped region are placed such that a current flowing through the first highly doped region flows anti-parallel to a current flowing through the second highly doped region.

19. The ESD protection circuit of claim 1 wherein the first resistor comprises a first lowly doped N-type region in a first N-well and the second resistor comprises a second highly doped P-type region in a second N-well.

20. The ESD protection circuit of claim 1 wherein the parasitic bipolar transistor comprises at least one distributed bipolar transistor.

* * * * *